(12) United States Patent
Tsai et al.

(10) Patent No.: US 10,096,515 B2
(45) Date of Patent: Oct. 9, 2018

(54) INTERCONNECT STRUCTURE FOR STACKED DEVICE

(71) Applicant: Taiwan Semiconductor Manufacturing Company, Ltd., Hsin-Chu (TW)

(72) Inventors: Shu-Ting Tsai, Kaohsiung (TW); Jeng-Shyan Lin, Tainan (TW); Dun-Nian Yaung, Taipei (TW); Jen-Cheng Liu, Hsin-Chu (TW); Feng-Chi Hung, Chu-Bei (TW); Chih-Hui Huang, Yongkang (TW); Sheng-Chau Chen, Kaohsiung (TW); Shih-Pei Chou, Tainan (TW); Chia-Chieh Lin, Kaohsiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 384 days.

(21) Appl. No.: 13/937,055

(22) Filed: Jul. 8, 2013

(65) Prior Publication Data

US 2014/0264929 A1 Sep. 18, 2014

Related U.S. Application Data

(60) Provisional application No. 61/798,459, filed on Mar. 15, 2013.

(51) Int. Cl.
*H01L 23/48* (2006.01)
*H01L 23/31* (2006.01)
(Continued)

(52) U.S. Cl.
CPC ...... *H01L 21/76898* (2013.01); *H01L 23/481* (2013.01); *H01L 24/80* (2013.01);
(Continued)

(58) Field of Classification Search
CPC ....... H01L 24/80; H01L 25/50; H01L 23/481; H01L 21/76898; H01L 2924/13091; H01L 2924/1305; H01L 25/0657
(Continued)

(56) References Cited

U.S. PATENT DOCUMENTS

| | | | | | |
|---|---|---|---|---|---|
| 5,098,856 | A | * | 3/1992 | Beyer | H01L 21/764 257/E21.573 |
| 5,891,799 | A | * | 4/1999 | Tsui | H01L 21/31116 257/E21.252 |

(Continued)

FOREIGN PATENT DOCUMENTS

CN 103367348 10/2013

OTHER PUBLICATIONS

Shu-Ting Tsai et al., U.S. Appl. No. 13/839,860, filed Mar. 15, 2013, for "Interconnect Structure and Method," 29 pages of specification, 14 pages of drawings.

(Continued)

*Primary Examiner* — Joseph C Nicely
*Assistant Examiner* — Thai T Vuong
(74) *Attorney, Agent, or Firm* — Haynes and Boone, LLP

(57) ABSTRACT

A stacked integrated circuit (IC) device and a method are disclosed. The stacked IC device includes a first semiconductor element. The first substrate includes a dielectric block in the first substrate; and a plurality of first conductive features formed in first inter-metal dielectric layers over the first substrate. The stacked IC device also includes a second semiconductor element bonded on the first semiconductor element. The second semiconductor element includes a second substrate and a plurality of second conductive features formed in second inter-metal dielectric layers over the second substrate. The stacked IC device also includes a conductive deep-interconnection-plug coupled between the
(Continued)

first conductive features and the second conductive features. The conductive deep-interconnection-plug is isolated by dielectric block, the first inter-metal-dielectric layers and the second inter-metal-dielectric layers.

20 Claims, 8 Drawing Sheets

(51) Int. Cl.
  *H01L 23/528*   (2006.01)
  *H01L 23/538*   (2006.01)
  *H01L 21/768*   (2006.01)
  *H01L 23/00*   (2006.01)
  *H01L 25/00*   (2006.01)
  *H01L 25/065*   (2006.01)

(52) U.S. Cl.
  CPC ........ *H01L 25/50* (2013.01); *H01L 21/76805* (2013.01); *H01L 24/92* (2013.01); *H01L 25/0657* (2013.01); *H01L 2224/80896* (2013.01); *H01L 2224/9202* (2013.01); *H01L 2224/94* (2013.01); *H01L 2225/06524* (2013.01); *H01L 2225/06541* (2013.01); *H01L 2225/06565* (2013.01); *H01L 2924/12036* (2013.01); *H01L 2924/12043* (2013.01); *H01L 2924/1305* (2013.01); *H01L 2924/13091* (2013.01); *H01L 2924/1431* (2013.01)

(58) Field of Classification Search
  USPC .......................................... 257/774; 438/637
  See application file for complete search history.

(56) References Cited

U.S. PATENT DOCUMENTS

| | | | |
|---|---|---|---|
| 6,078,088 A * | 6/2000 | Buynoski | H01L 23/5222 257/410 |
| 8,124,522 B1 * | 2/2012 | Wu et al. | 438/618 |
| 2002/0074670 A1 | 6/2002 | Suga | |
| 2006/0292744 A1 | 12/2006 | Enquist et al. | |
| 2007/0096263 A1 * | 5/2007 | Furukawa | H01L 21/76898 257/621 |
| 2007/0128847 A1 * | 6/2007 | Hong | H01L 21/76834 438/624 |
| 2007/0132101 A1 * | 6/2007 | Park | H01L 21/76808 257/751 |
| 2010/0044869 A1 * | 2/2010 | Zhang | H01L 21/76829 257/773 |
| 2012/0256311 A1 | 10/2012 | Takeda et al. | |
| 2013/0175673 A1 | 7/2013 | Jin et al. | |
| 2013/0264688 A1 * | 10/2013 | Qian et al. | 257/622 |
| 2014/0264947 A1 | 9/2014 | Lin et al. | |

OTHER PUBLICATIONS

Chinese Patent Office, Office Action dated May 4, 2016, Application No. 201310463691.4, 22 pages.

* cited by examiner

INTERCONNECT STRUCTURE FOR STACKED DEVICE

This patent claims the benefit of U.S. Ser. No. 61/798,459 filed Mar. 15, 2013, which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor technologies further advance, stacked IC devices have emerged as an effective alternative to further reduce the physical size of a semiconductor device. In a stacked IC device, active circuits such as logic, memory, processor circuits and the like are fabricated on different semiconductor wafers. Two or more semiconductor wafers are then positioned on top of one another to form a stacked IC. For example, two semiconductor wafers may be bonded together through suitable bonding techniques, and thereafter assembled into a single stacked IC device. One advantage of a stacked IC device is that high density can be achieved. Although existing stacked IC devices and methods of fabricating stacked IC devices have been generally adequate for their intended purposes, they have not been entirely satisfactory in all respects. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
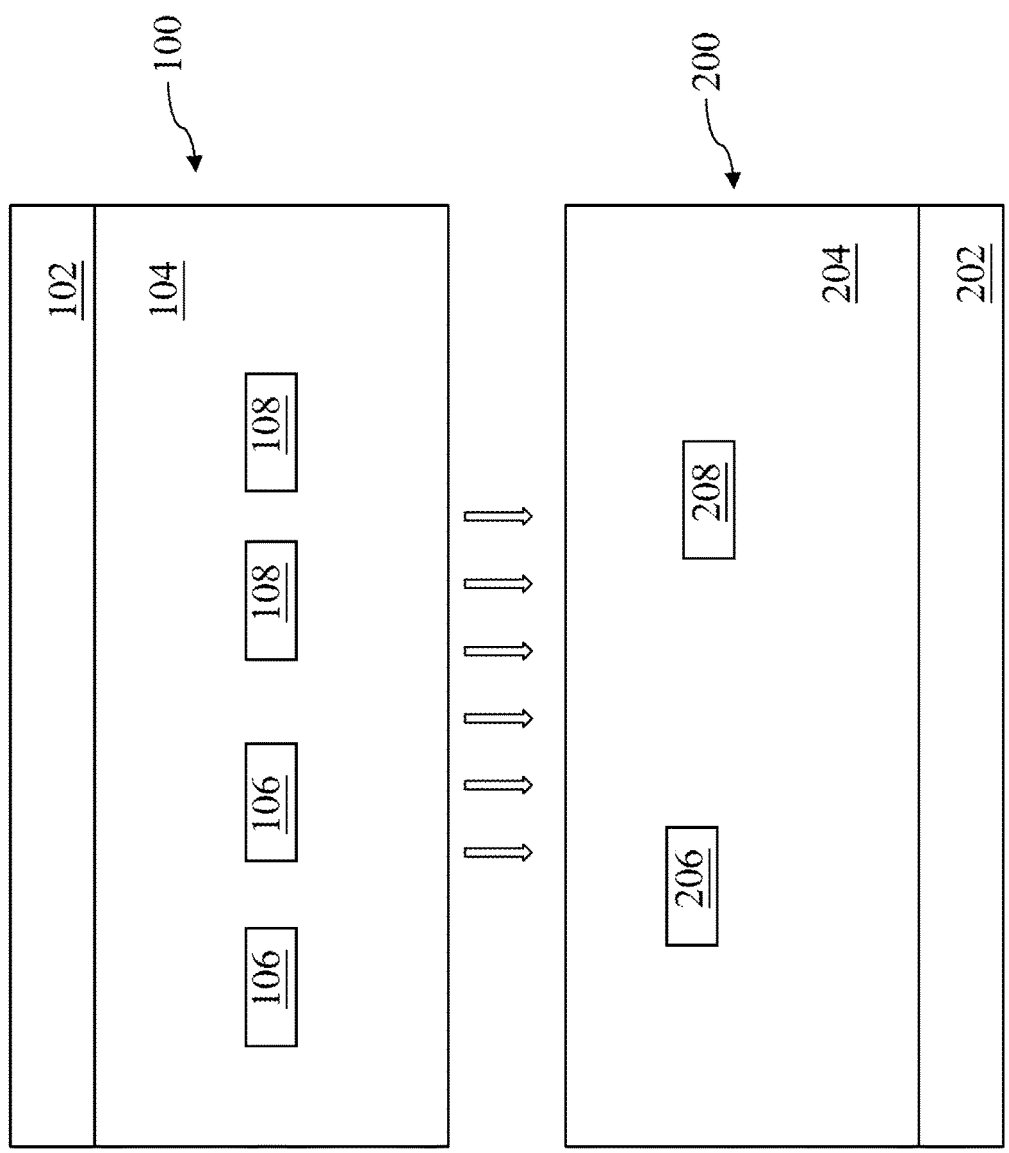
FIG. 1 is a cross-sectional view of a stacked integrated circuit (IC) device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of a stacked IC device prior to a bonding process according to various aspects of the present disclosure. FIG. 1 has been simplified for the sake of clarity to better illustrate the inventive concepts of the present disclosure. The figure shows a first semiconductor wafer 100 to be stacked on top of a second semiconductor wafer 200. For example, the first semiconductor wafer 100 is an image sensor, such as a backside illuminated image sensor (BIS), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor wafer 100 may include a transistor to generate a signal related to the intensity or brightness of light that impinges on the photo active region. Continuing with the present example, the second semiconductor wafer 200 is an application-specific integrated circuit (ASIC) wafer.

As shown in FIG. 1, the first semiconductor wafer 100 (shown in an upside down position) includes a first substrate 102 and one or more first inter-metal dielectric (IMD) layers 104 formed over the first substrate. In addition, a plurality of first conductive features, such as conductive features 106 and 108, are formed in the IMD layers 104.

The first substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The first substrate 102 may also comprise non-semiconductor materials including soda-lime glass, fused silica, fused quartz, calcium fluoride ($CaF_2$), and/or other suitable materials. In some embodiments, the first substrate 102 has one or more layers defined within it, such as an epitaxial layer. For example, in one such embodiment, the first substrate 102 includes an epitaxial layer overlying a bulk semiconductor. Other layered substrates include semiconductor-on-insulator (SOI) substrates. In one such SOI substrate, the first substrate 102 includes a buried oxide (BOX) layer formed by a process such as separation by implanted oxygen (SIMOX). In various embodiments, the first substrate 102 may take the form of a planar substrate, a fin, a nanowire, and/or other forms known to one of skill in the art.

The first substrate 102 may include one or more doped regions. In the depicted embodiment, the first substrate 102 is doped with a p-type dopant. Suitable p-type dopants include boron, gallium, indium, other suitable p-type dopants, and/or combinations thereof. The first substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

In various embodiments, the first substrate 102 may take a form of a planar substrate, a fin, a nanowire, and/or other forms known to one of skill in the art.

The first semiconductor wafer 100 may include various passive and active microelectronic components. These components may include a primary component, such as an image sensor element and a peripheral circuit element, such as one or more field effect transistor. Other examples include P-channel field effect transistors (PFETs), N-channel FETs (NFETs), metal-oxide semiconductor field effect transistors (MOSFETs), CMOS transistors, FinFETs, high voltage transistors, high frequency transistors, bipolar junction transistors, resistors, capacitors, diodes, fuses, other suitable devices, and/or combinations thereof. In some embodiments, the peripheral circuit element is operable to interface with or control the primary element. Although, in further embodiments, the peripheral circuit element has no functional relationship to the primary element aside from being collocated on the same substrate 102

The first IMD layers 104 may include silicon oxide, silicon nitride, silicon oxynitride, polyimide, or other suitable materials. The first IMD layers 104 can be formed by chemical vapor deposition (CVD), high-density plasma CVD (HDP-CVD), physical vapor deposition (PVD), atomic layer deposition (ALD), and/or other suitable deposition processes. The first IMD layers 104 may include multiple layers made by different dielectric materials.

The first conductive features 106 and 108 may be made through any suitable formation processes (e.g., lithography with etching, damascene, dual damascene, or the like) and may be formed using suitable conductive materials such as copper, aluminum, aluminum alloys, copper alloys or the like.

Additional features can be incorporated into the first semiconductor wafer 100 and some of the features described above can be replaced or eliminated for other embodiments of the first semiconductor wafer 100.

The second semiconductor wafer 200 can include similar or different elements, as compared to the first semiconductor wafer 100. For example, the second semiconductor wafer 200 includes a second substrate 202, second IMD layers 204 and a plurality of second conductive features 206 and 208.

Figure 2:
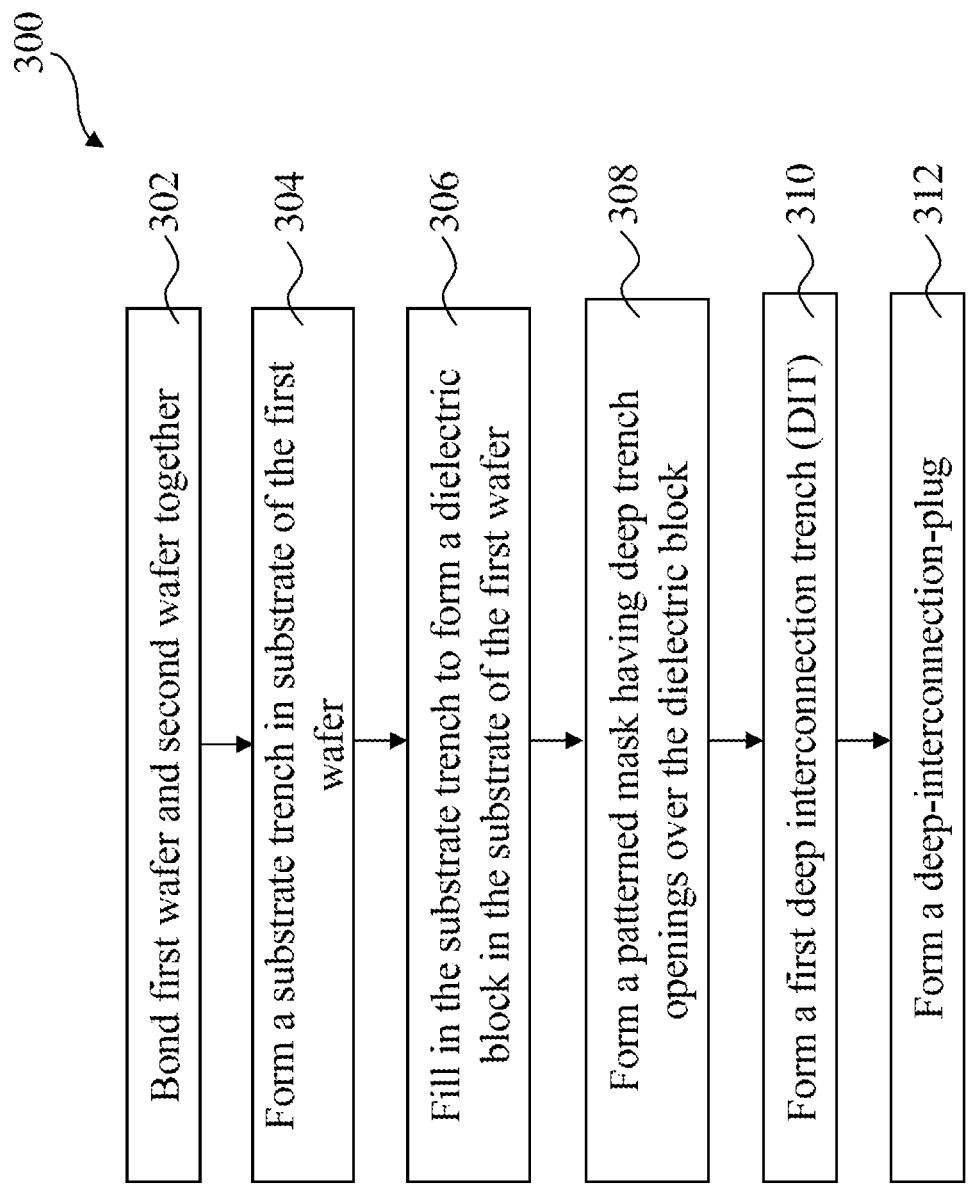
FIG. 2 is a flow chart of an example method for fabricating a stacked IC device according to various aspects of the present disclosure.

FIG. 2 is a flowchart of a method 300 for forming a stacked IC device according to aspects of the present disclosure. FIGS. 3A-3B and 4-7 are cross-sectional views of an example stacked IC device 400 undergoing processes according to the method of FIG. 2. It is understood that additional steps can be provided before, during, and after the method, and some of the steps described can be replaced or eliminated for other embodiments of the method.

Figure 3A:
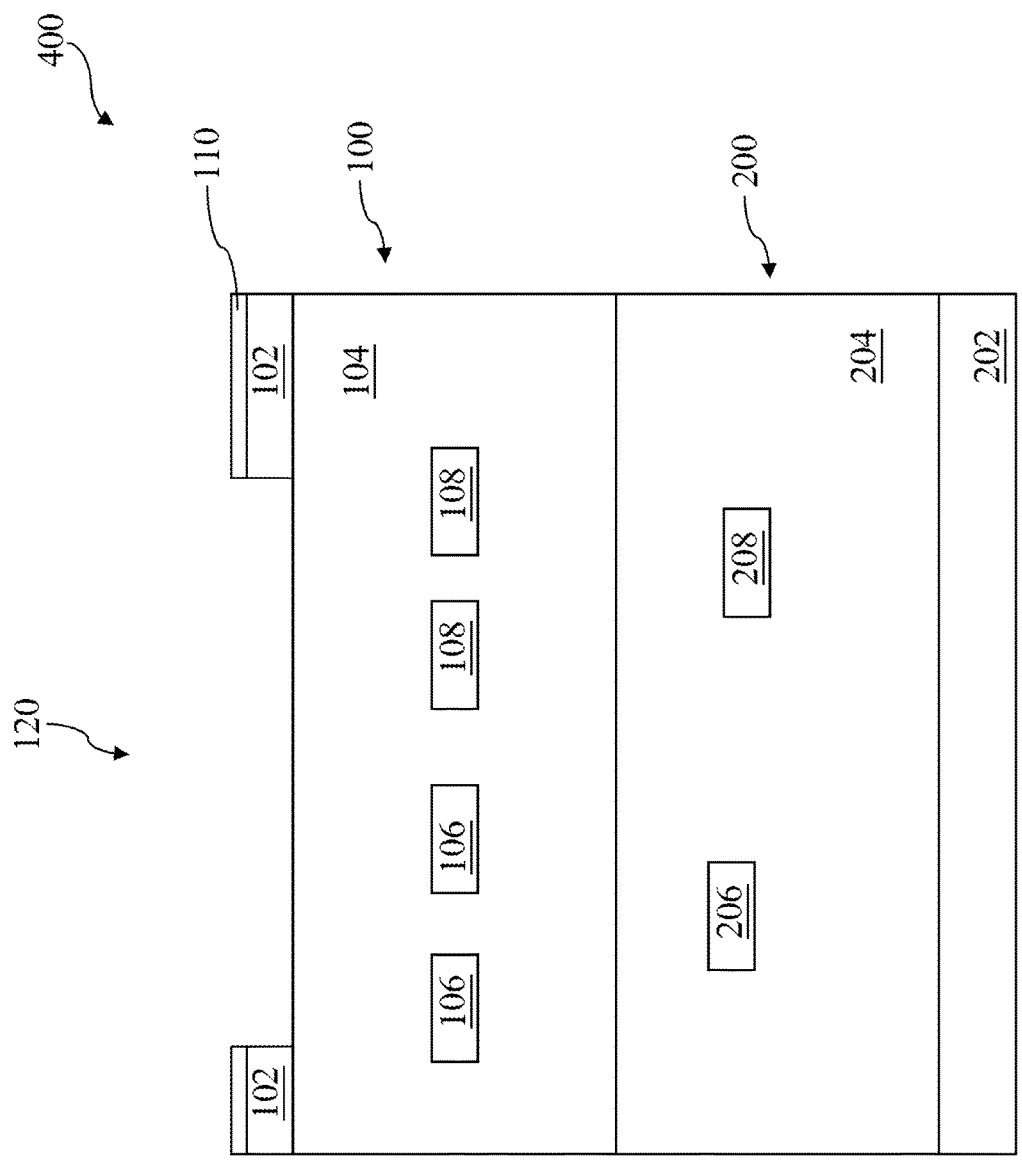
FIGS. 3A-3B and 4-7 are cross-sectional views of an example stacked IC device at fabrication stages constructed according to the method of FIG. 2.

Referring to FIGS. 2 and 3A, the method 300 begins at step 302 by bonding the first and second semiconductor wafers, 100 and 200, together through suitable bonding techniques such as direct bonding. In one embodiment, a plurality of bonding pads is formed in the first and second semiconductor wafers, 100 and 200, respectively. In this embodiment, the bonding pads located at the second semiconductor wafer 200 are aligned face-to-face with their corresponding bonding pads located at the first semiconductor wafer 100. In accordance with some embodiments, in a direct bonding process, the connection between the first and second semiconductor wafers, 100 and 200, can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or combination thereof. In some embodiments, the first and second semiconductor wafers, 100 and 200, are connected to each other through suitable three-dimensional structure. An adhesion layer may also be used.

Additionally, a thinning process may be performed to thin either or both substrates from the backside. The thinning process may include a mechanical grinding process and/or a chemical thinning process. For example, a substantial amount of substrate material may be first removed from the first substrate 102 during the mechanical grinding process. Afterwards, the chemical thinning process may apply an etching chemical to the back side of the first substrate 102 to further thin the first substrate 102.

Referring also to FIGS. 2 and 3A, the method 300 proceeds to step 304 by removing a portion of the first substrate 102 to form a substrate trench 120. In one embodiment, a bottom anti-reflection coating (BARC) layer 110 is formed over a backside of the first substrate 102. The BARC layer 110 may include a nitride material, an organic material, an oxide material and the like. The BARC layer 110 may be formed using suitable techniques such as CVD, PVD and/or the like.

The substrate trench 120 may be formed by lithography and etch processes. As an example, a patterned photoresist layer is formed over the first substrate 102 by processes of spin-on coating, exposure and developing. Then first substrate 102 is etched through the patterned photoresist. The etching process may include dry etching process, wet etching process, and/or combination thereof. The etching process may also include a selective wet etch or a selective dry etch. Example wet etching solutions include a tetramethylammonium hydroxide (TMAH), a HF/HNO3/CH3COOH solution, or other suitable solution. An example dry etching processes may include a biased plasma etching process that uses a chlorine-based chemistry. Other example dry etchant gasses include CF4, NF3, SF6, and He. In some embodiment, a selective etch is performed with adequate etch selectivity with respect to the first IMD layer 104.

Figure 3B:
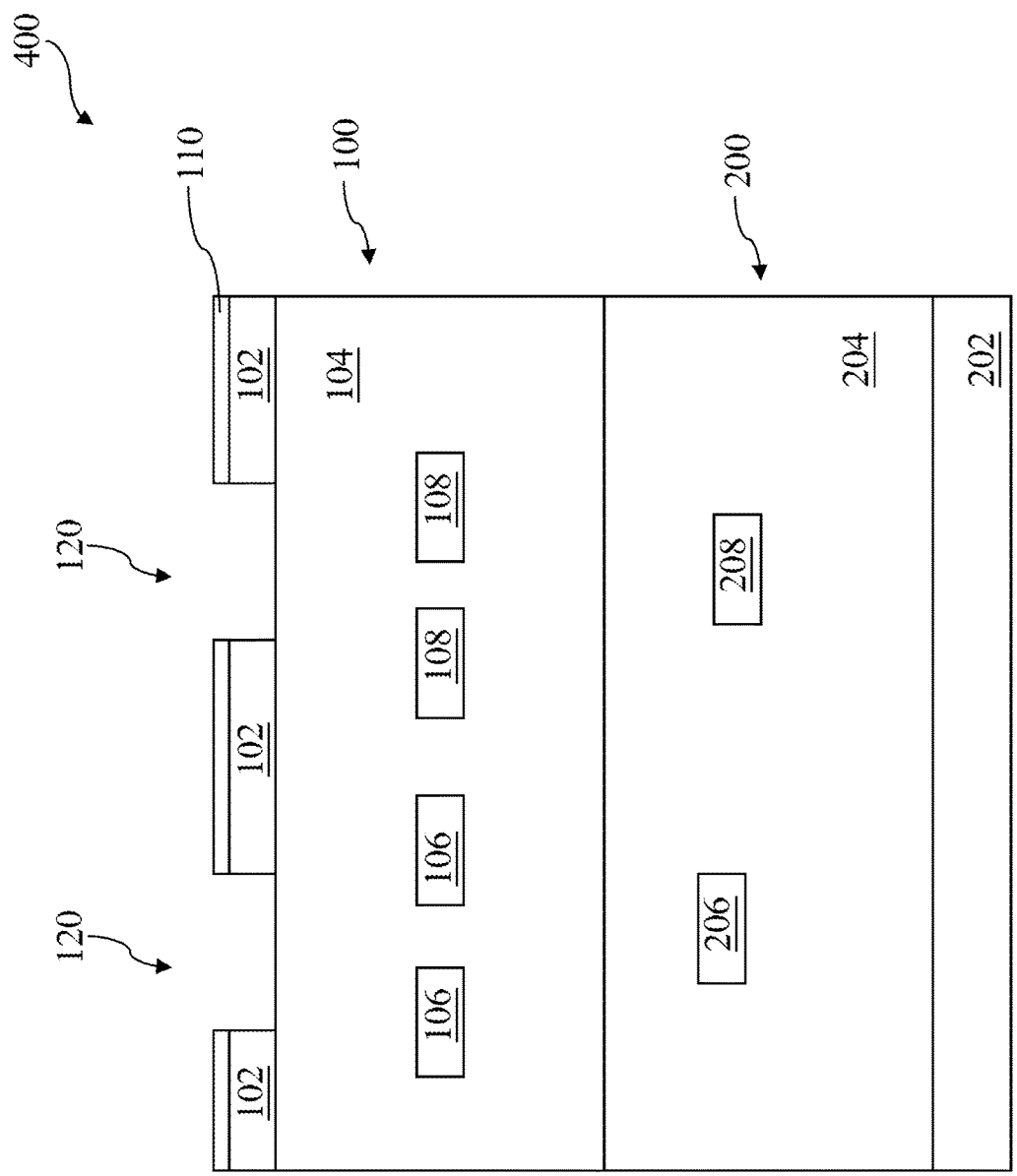

In one embodiment, a size of the substrate trench 120 is formed such that it will include more than one deep-interconnection-plug, as shown in FIG. 3A. This will be described in detail below. In another embodiment, a size of the substrate trench 120 is formed such that it includes single future deep-interconnection-plug, as shown in FIG. 3B. The following disclosure will be directed to the embodiment of FIG. 3A, for the sake of example. It is understood that similar steps can be implemented on the embodiment of FIG. 3B.

Figure 4:
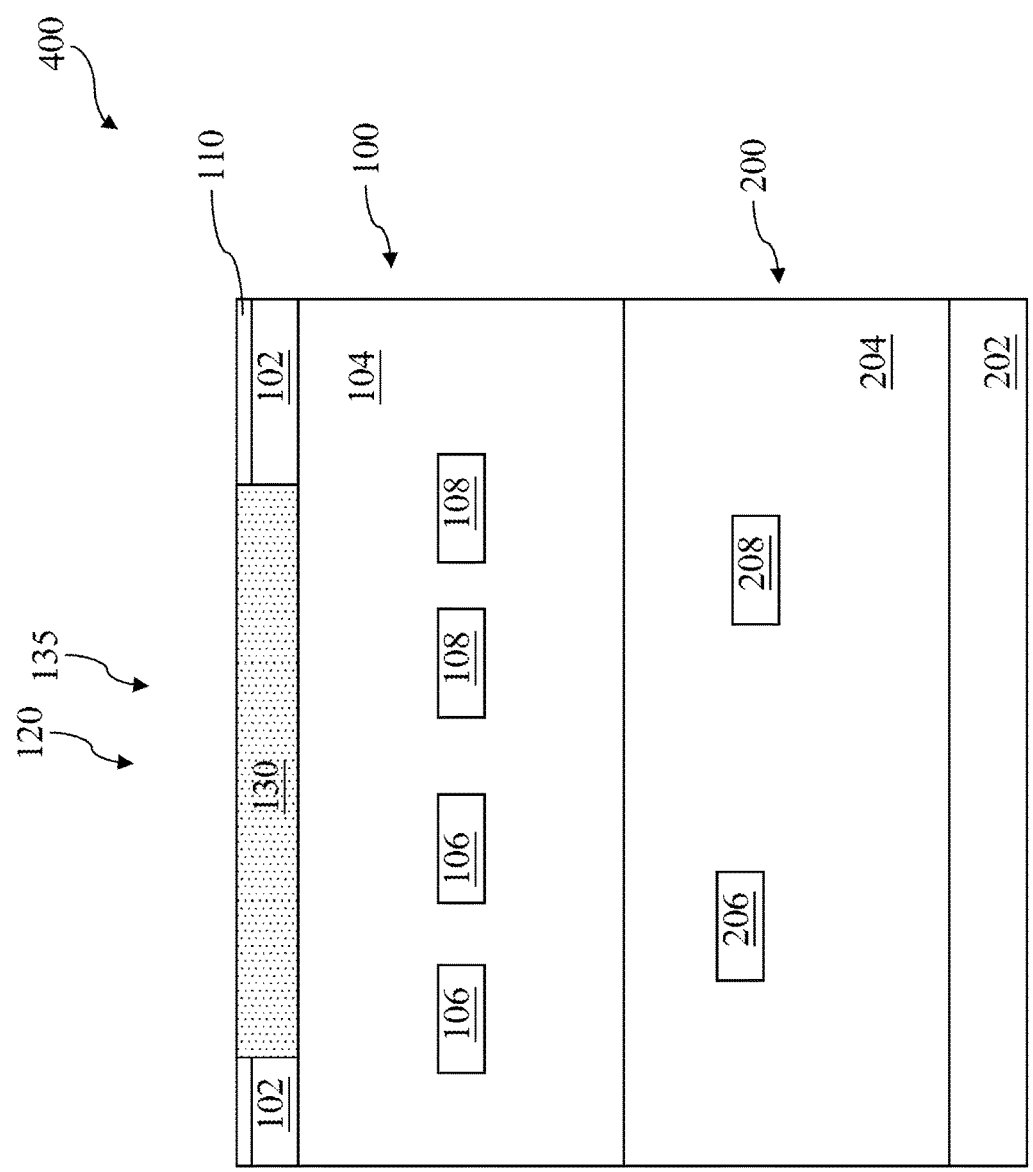

Referring to FIGS. 2 and 4, the method 300 proceeds to step 306 by filling in the substrate trench 120 with a dielectric layer 130 to form a dielectric block 135 in the first substrate 102. The dielectric layer 130 may include dielectric materials such as silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, low-k dielectric materials, other suitable material, and/or combinations thereof. Common methods for depositing the dielectric layer 130 include thermal oxidation, CVD, high-density plasma CVD (HDP-CVD), PVD, ALD, spin-on deposition, and/or other suitable deposition processes.

In the present embodiment, a process, such as a chemical mechanical polishing (CMP), is applied to planarize the top surface of the dielectric block 135 with the first substrate 102, to achieve a substantial planar surface for a later lithography process.

Figure 5:
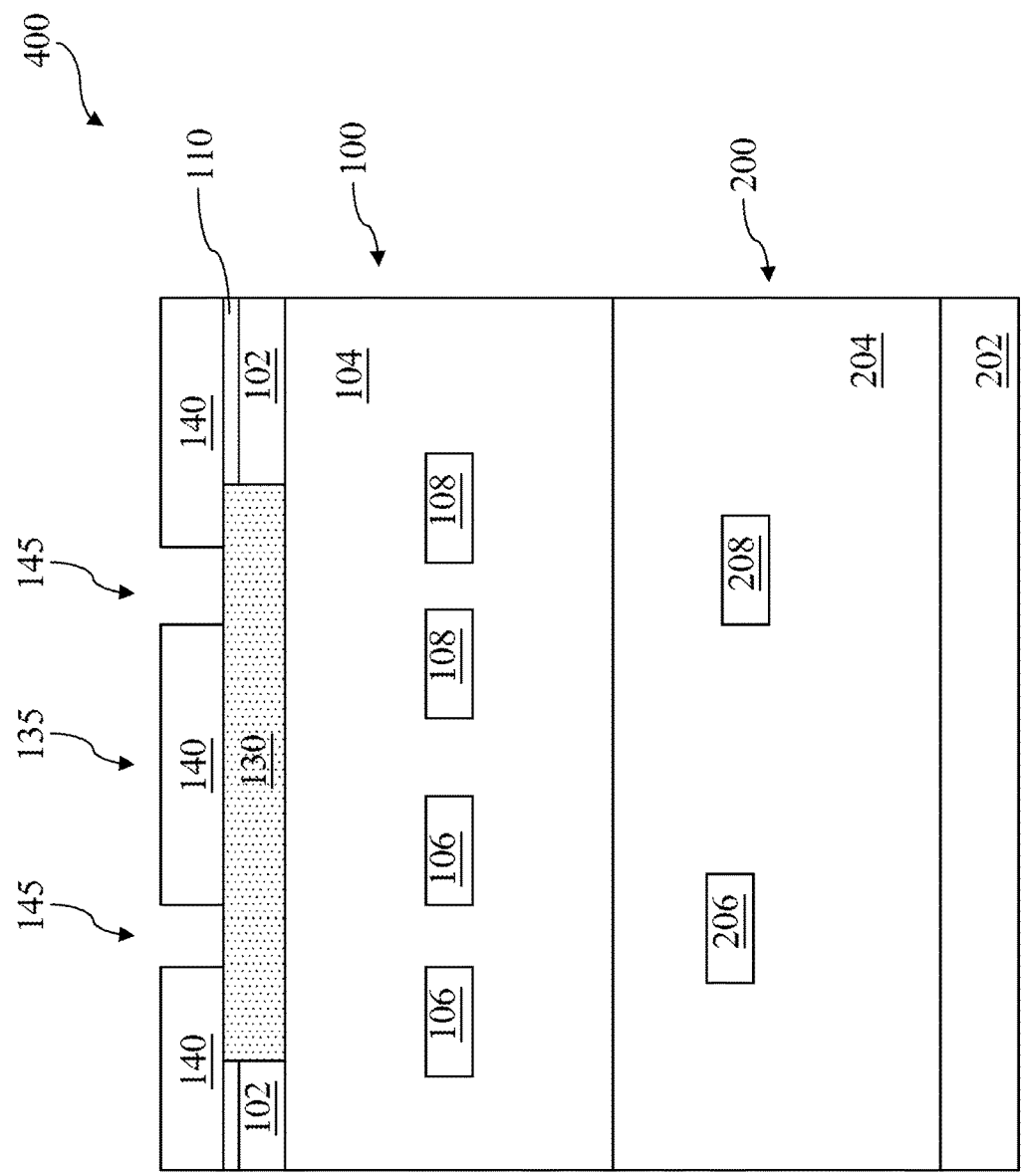

Referring to FIGS. 2 and 5, the method 300 proceeds to step 308 by forming a patterned mask 140 having deep-interconnect-trench (DIT) openings 145 over the first substrate 102, including the dielectric block 135. The patterned mask 140 may be a photoresist layer or a hardmask. The patterned mask 140 is formed on the top surface of the first substrate 102 and the dielectric block 135 by suitable deposition, photolithography and etching techniques. In the present embodiment, the patterned mask 140 is formed on a substantially flat surface made by the first substrate 102 and the dielectric block 135, which may improve the process window of lithography process. The DIT openings 145 align with the corresponding conductive features, 206 and 208, located in the second semiconductor wafer 200.

Figure 6:
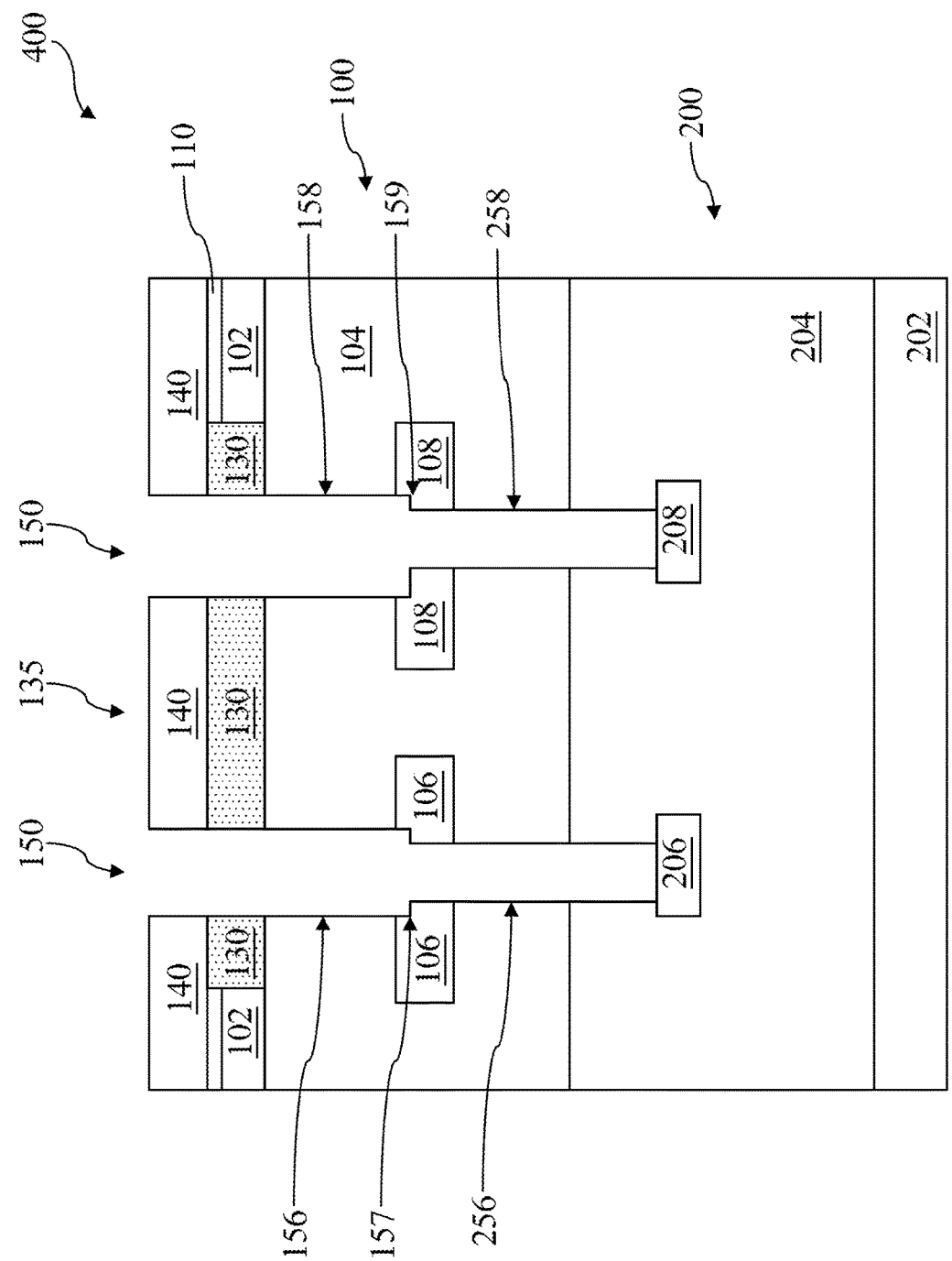

Referring to FIGS. 2 and 6, the method 300 proceeds to step 310 by forming deep-interconnection-trenches (DITs) 150 traveling from the first semiconductor wafer 100 to the second semiconductor wafer 200. The DITs 150 are formed with upper portions, 156 and 158, and lower portions, 256 and 258, respectively. Through the DIT openings 145, the upper portions (156 and 158) of the DITs 150 are formed by etching the dielectric block 135 and the first IMD layers 104 and the lower portion of the DITs 150 (256 and 258) are formed by etching the first and second IMD layers, 104 and 204, as well as a bonding interface to two stacked wafers. At least a portion of conductive features 106, 108, 206 and 208 are exposed in the DITs 150.

A suitable etching process includes a dry etch, an anisotropic wet etch, or any other suitable etch. In the present embodiment, a selective etching process with adequate etch selectivity with respect to the conductive features 106 and 108 is applied. As such, the conductive features 106 and 108 may function as a hard mask layer (a "built-in" hard mask) for the etching process of the IMD layers 104 and 204. In one embodiment, a selective etching process may be employed to etch the IMD layers 104 and 204 rapidly while etching only a small portion of the conductive features 106 and 108. An exposed portion of the hard mask layers (e.g., conductive features 106 and 108) are partially etched away, thereby a recess such as recesses 157 and 159 are formed. A depth of the recesses 157 and 159 may vary depending on different applications and design needs.

Figure 7:
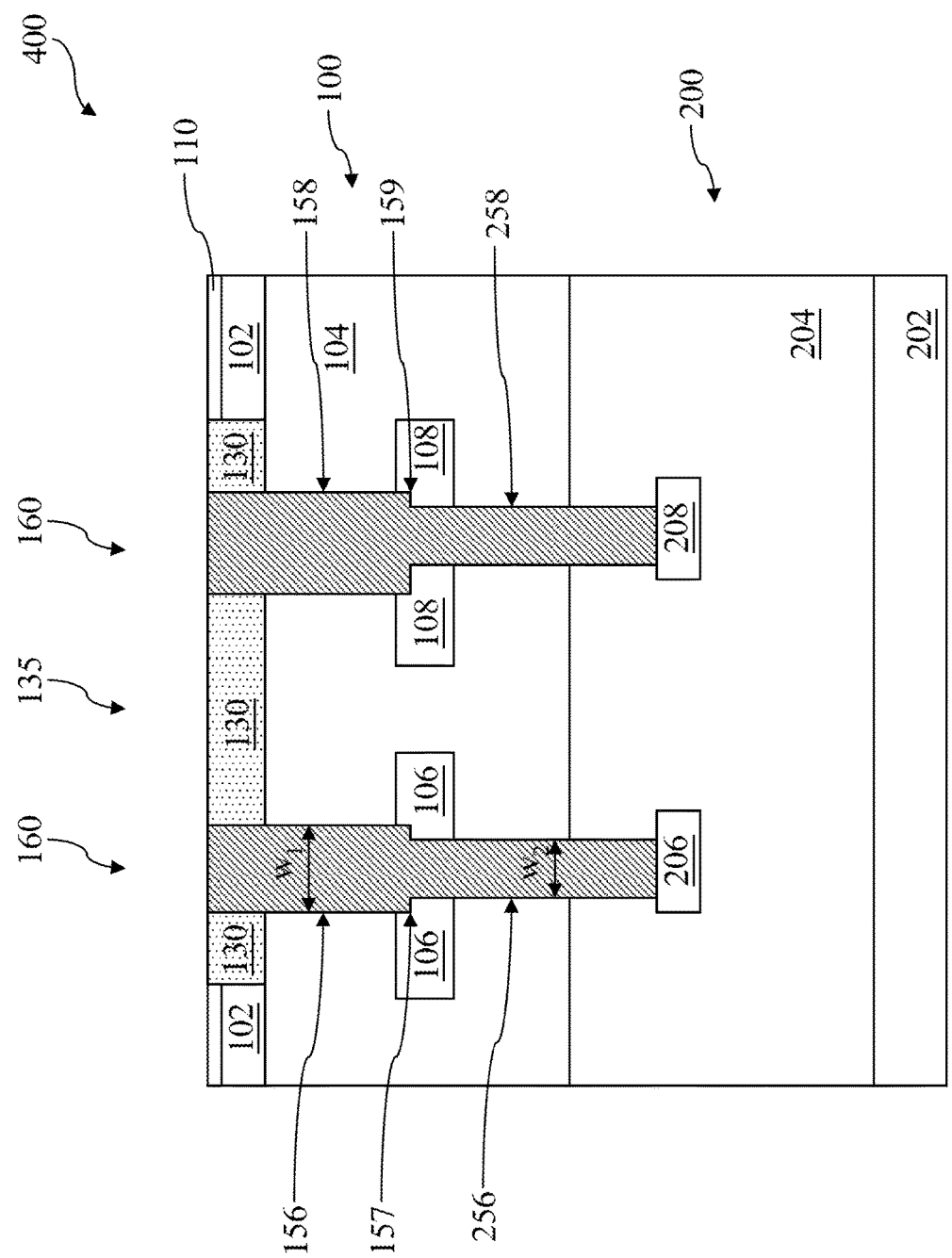

Referring to FIGS. 2 and 7, the method 300 proceeds to step 312 by filling in the DITs 150 with conductive materials to form deep-interconnect-plugs (DIPs) 160. The DIPs 160 include highly-conductive and low-resistive metal, elemental metal, transition metal, or the like. For example, the DIPs 160 include copper, copper alloy, such as copper magnesium (CuMn), copper aluminum (CuAl) or copper silicon (CuSi), although other materials, such as tungsten, aluminum could alternatively be utilized. The DIPs 160 may be formed by any suitable method known in the art such as PVD, sputter, CVD, electroplating and/or the like. In one embodiment, the DIP 160s are further surrounded by a barrier layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). The DIPs 160 are formed with an upper portion having the first width $w_1$ and a lower portion having the second width $w_2$. In the present embodiment, the first width $w_1$ is substantially larger than the second width $w_2$. The dielectric block 135 and the first IMD layers 104 provide electric isolation to the upper portion of the DIP 160, while the first and second IMD layers, 104 and 204, provide electric isolation to the lower portion of the DIP 160. Additionally, a chemical mechanical polishing (CMP) may be applied to remove the conductive material for planarization effect if a desired topography is needed.

It should be noted that while FIG. 7 illustrates two semiconductor wafers stacked together, one skilled in the art will recognize that the stacked semiconductor device shown in FIG. 7 is merely an example. There may be many alternatives, variations and modifications. For example, the stacked semiconductor device may accommodate more than two wafers.

Based on the above, the present disclosure offers a stacked IC device employing structures and formations of a dielectric block and a deep-interconnection-trench. The dielectric block provides a substantially planner surface for lithography process of the deep-interconnection-trench and it has demonstrated process window improvement. The deep-interconnection-trench is formed by a selective etching process with adequate etch selectivity to utilize a "built-in" hard mask to gain process flexibility and control.

The present disclosure provides many different embodiments of a stacked integrated circuit (IC) device. The stacked IC device includes a first semiconductor element. The first substrate includes a dielectric block in the first substrate; and a plurality of first conductive features formed in first inter-metal dielectric layers over the first substrate. The stacked IC device also includes a second semiconductor element bonded on the first semiconductor element. The second semiconductor element includes a second substrate and a plurality of second conductive features formed in second inter-metal dielectric layers over the second substrate. The stacked IC device also includes a conductive deep-interconnection-plug coupled between the first conductive features and the second conductive features. The conductive deep-interconnection-plug is isolated by dielectric block, the first inter-metal-dielectric layers and the second inter-metal-dielectric layers. The conductive deep-interconnection-plug includes an upper portion formed over a first side of a hard mask layer. The upper portion is of a first width. The conductive deep-interconnection-plug also has a lower portion formed over a second side of the hard mask layer. The lower portion is of a second width, which is substantially less than the first width.

In another embodiment, a stacked integrated circuit (IC) device includes a first semiconductor element having a first substrate and a dielectric block disposed in the first substrate, and first conductive features. The stacked IC device also has a second semiconductor element bonded on the first semiconductor element. The second semiconductor element includes a second substrate and second conductive features over the second substrate. The stacked IC device also includes a conductive deep-interconnection-plug coupled between the first and second conductive features. The conductive deep-interconnection-plug includes an upper portion is isolated by the dielectric block and a lower portion with a width, which is much small than a width of the upper portion.

In yet another embodiment, a method for fabricating a stacked integrated circuit (IC) device includes providing a first semiconductor element. The first semiconductor element includes a first substrate, a first inter-metal-dielectric (IMD) layer over the first substrate and a conductive feature in the first IMD layer. The method also includes bonding the first semiconductor element on a second semiconductor element. The second semiconductor element includes a second substrate, a second inter-metal-dielectric (IMD) layer over the second substrate and a second conductive feature in the second IMD layers. The method also includes forming a substrate trench in the first substrate, filling in the substrate trench with a dielectric material to form a dielectric block with a substantial flat surface with the first substrate, forming a patterned mask over the flat first substrate and the dielectric block, etching the dielectric block, the first IMD layer and the partial second IMD layer through the pattern mask to form a deep-interconnection-trench and filling in the deep-interconnection-trench with conductive materials to form a deep-interconnection-plug to couple the first and second conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising: a first semiconductor element comprising: a first substrate; a dielectric block in the first substrate; and a plurality of first conductive features formed in first inter-metal- dielectric layers over the first substrate, wherein each of the first conductive features has a first segment having a first thickness and a second segment having a second thickness that is different from the first thickness, and wherein a side surface of the first segment and an upper surface of the second segment collectively define a partial recess; a second semiconductor semiconductor element bonded to the first semiconductor element, wherein the second semiconductor element comprises: a second substrate; and a plurality of second conductive features formed in second inter- metal-dielectric layers over the second substrate; and a conductive deep-interconnection-plug coupled between the first conductive features and the second conductive features and isolated by dielectric block, the first inter-metal-dielectric layers and the second inter-metal-dielectric layers, the conductive deep-interconnection-plug including: an upper portion formed in the dielectric block and the first inter- metal-dielectric layers, wherein the upper portion is of a first width; and a lower portion formed in the first and second inter-metal-dielectric layers, wherein the lower portion is of a second width less than the first width.

2. The device of claim 1, wherein the conductive deep-interconnection-plug fills the partial recess in a manner such that no portions of the first inter-metal dielectric layers are disposed between the deep-interconnection-plug and the first conductive features within the partial recess.

3. The device of claim 1, wherein the upper portion of the conductive deep-interconnection-plug is isolated by the dielectric block and the first inter-metal dielectric layers.

4. The device of claim 1, wherein the lower portion of the conductive deep-interconnection-plug is isolated by the second inter-metal dielectric layers.

5. The device of claim 1, wherein multiple deep-interconnection-plugs are formed in a single dielectric block.

6. The device of claim 1, wherein a single deep-interconnection-plug is formed in the dielectric block.

7. The device of claim 1, wherein the second segment of each of the first conductive features is in direct contact with the conductive deep-interconnection-plug, and wherein the second thickness is less than the first thickness.

8. A stacked integrated circuit device comprising: a first semiconductor element having a first substrate, a dielectric block disposed in the first substrate, and first conductive features over the first substrate, wherein each of the first conductive features has a first segment having a first thickness and a second segment having a second thickness that is different from the first thickness, wherein a sidewall of the first segment is not aligned with a sidewall of the second segment, and wherein the first segment and the second segment jointly define a partial recess; a second semiconductor element bonded to the first semiconductor element, wherein the second semiconductor element comprises a second substrate and second conductive features over the second substrate; and a conductive deep-interconnection-plug coupled between the first and second conductive features and filling the partial recess, wherein the conductive deep- interconnection-plug comprises: an upper portion with a first width, wherein a portion of the upper portion isolated by the dielectric block; and a lower portion with a second width.

9. The device of claim 8, wherein the first width of the upper portion of the conductive deep-interconnection-plug is substantially larger than the second width of the lower portion.

10. The device of claim 8, further comprising: first inter-metal-dielectric (IMD) layers disposed in the first semiconductor element; and second inter-metal-dielectric (IMD) layers disposed in the second semiconductor element.

11. The device of claim 10, wherein the upper portion of the deep-interconnection-plug is disposed in the dielectric block and first IMD layers, wherein the lower portion of the deep-interconnection-plug is disposed in the first and second IMD layers.

12. The device of claim 8, wherein multiple deep-interconnection-plugs are formed in a single dielectric block.

13. The device of claim 8, wherein a single deep-interconnection-plug is formed in the dielectric block.

14. A device comprising: a first substrate; a dielectric element disposed in the first substrate; a first interconnect structure disposed over the first substrate, wherein the first interconnect structure contains a first inter-metal-dielectric (IMD) and a first conductive element embedded in the first IMD, wherein the first conductive element has a first segment having a first thickness and a second segment having a second thickness that is different from the first thickness, and wherein a side surface of the first segment in combination with an upper surface of the second segment define a partial recess; a second substrate; a second interconnect structure disposed over the second substrate, wherein the second interconnect structure is attached to the first interconnect structure, and wherein the second interconnect structure contains a second IMD and a second conductive element embedded in the second IMD; and an elongated interconnection plug that extends through the first substrate, through the first interconnect structure and filling the partial recess, and through a portion of the second interconnect structure, wherein the elongated interconnection plug is electrically coupled to both the first conductive element and the second conductive element; and a barrier layer surrounding the elongated interconnection plug, wherein the barrier layer is in physical contact with a sidewall of the first conductive element.

15. The device of claim 14, wherein:
   a first end portion of the elongated interconnection plug is circumferentially surrounded by the dielectric element disposed in the first substrate; and
   a second end portion of the elongated interconnection plug is in direct physical contact with the second conductive element.

16. The device of claim 15, wherein:
   a third portion of the elongated interconnection plug is disposed between the first end portion and the second end portion, the third portion having a first side surface and a second side surface; and
   the first side surface is in direct physical contact with the first conductive element.

17. The device of claim 16, wherein:
   the first interconnect structure further contains an additional first conductive element embedded in the first IMD; and
   the second side surface is in direct physical contact with the additional first conductive element.

18. The device of claim 15, wherein:
   the first end portion has a first lateral dimension; and
   the second end portion has a second lateral dimension that is smaller than the first lateral dimension.

19. The device of claim 14, further comprising a plurality of additional elongated interconnection plugs.

20. The device of claim 14, wherein a surface of the first substrate facing away from the first interconnect structure is substantially planar.

\* \* \* \* \*